United States Patent [19]

Kurtz et al.

[11] Patent Number: 4,814,856
[45] Date of Patent: Mar. 21, 1989

[54] INTEGRAL TRANSDUCER STRUCTURES EMPLOYING HIGH CONDUCTIVITY SURFACE FEATURES

[75] Inventors: Anthony D. Kurtz, Teaneck; Timothy A. Nunn, Ridgewood; Richard A. Weber, Denville, all of N.J.

[73] Assignee: Kulite Semiconductor Products, Inc., Leonia, N.J.

[21] Appl. No.: 860,523

[22] Filed: May 7, 1986

[51] Int. Cl.⁴ .................................... H01L 27/20
[52] U.S. Cl. .......................... 357/73; 357/26; 357/1
[58] Field of Search ............ 357/4, 26, 74, 79, 51

[56] References Cited

U.S. PATENT DOCUMENTS

| | | | |
|---|---|---|---|
| 3,577,044 | 5/1971 | Armstrong et al. | 357/49 |
| 3,602,981 | 9/1971 | Kool | 357/26 |
| 3,614,678 | 10/1971 | Engeler | 357/26 |
| 3,620,833 | 11/1971 | Gleim | 357/26 |
| 3,753,196 | 8/1973 | Kurtz et al. | 357/26 |
| 3,800,264 | 3/1974 | Kurtz et al. | 357/26 |
| 3,922,705 | 11/1975 | Yerman | 357/26 |
| 4,203,128 | 5/1980 | Guckel et al. | 357/4 |
| 4,204,185 | 5/1980 | Kurtz et al. | 357/26 |
| 4,216,404 | 8/1980 | Kurtz et al. | 357/26 |
| 4,426,768 | 1/1984 | Black et al. | 357/26 |

Primary Examiner—Andrew J. James
Assistant Examiner—S. V. Clark
Attorney, Agent, or Firm—Arthur L. Plevy

[57] ABSTRACT

A semiconductor transducer structure is fabricated by utilizing varying height diffused layers in a sacrificial wafer. A carrier wafer has a dielectric layer on a top surface which includes a layer of glass. The sacrificial wafer, after beign subject to diffusion of highly doped semiconductor material, exhibits a plurality of varying depth regions. These regions manifest the basic transducer structure. By utilizing selective etching, one can thus form a transducer structure on the sacrificial wafer which is bonded to the carrier wafer by means of an electrostatic bond. The resultant method and structure enables one to provide transducers with improved operating characteristics which are adaptable for many different modes of operation.

24 Claims, 4 Drawing Sheets

INTEGRAL TRANSDUCER STRUCTURES EMPLOYING HIGH CONDUCTIVITY SURFACE FEATURES

BACKGROUND OF THE INVENTION

This invention relates to semiconductor transducers in general and more particularly to a transducer structure which employs an integral structure formed of highly doped diffused regions. The resultant structure as fabricated by the methods described includes a complete integral semiconductor transducer which possesses great advantages over those transducers depicted in the prior art.

Presently semiconductor transducers, because of their relatively small dimensions, are finding wide use in a variety of applications. These devices, although extremely small, possess high reliability and increased response. Such devices are widely utilized in the medical field, the electronics field, and various other fields for making pressure measurements. It is, of course, understood that for many stringent applications great care has to be taken in providing a small and reliable device while making the device as sensitive as possible. In regard to this, certain applications require that the piezoresistive elements be dielectrically isolated from the diaphragm on which they are located. Other applications require that the entire bridge array, which consists of piezoresistive elements, be hermetically sealed. In certain other applications it is required that there be a stop mechanism to prevent the transducer from being subjected to excessive forces. Hence, the prior art is replete with a number of patents which show various devices adapted to solve these problems. It is understood that devices incorporating these features require different processing techniques which oftentimes are difficult and time consuming to implement.

Essentially, the piezoresistive transducer employs a silicon resistive element, the resistance of which varies according to the intensity or magnitude of an applied force upon an associated diaphragm. Such resistors comprise serpentine or tortuous line patterns. The piezoresistive element, varies resistance according to the intensity of an applied force. The force is usually applied to a relatively thin diaphragm of metal or semiconductor material which is a membrane like structure and to which the semiconductor element is mounted or otherwise diffused therein. A force applied to the diaphragm serves to deflect the diaphragm and hence causes the associated piezoresistive element to vary resistance in accordance with the deflection. The force being measured is transferred through the diaphragm to the strain responsive element causing the element to expand or compress. This produces a change in the resistance of the element. Such elements are conventionally arranged as Wheatstone Bridge circuits with one to four of the bridge legs being active. For examples of typical prior art transducers, reference is made to U.S. Pat. No. 4,063,209 entitled "Integral Transducer Assemblies Employing Built In Pressure Limiting" issued on Dec. 13, 1977 to A. D. Kurtz et al. and assigned to the assignee herein. In that patent there is shown a transducer of an H-shaped cross section which employs a depression relatively equal to the line width of the diffused piezoresistor which is located in the depression. The depression is sealed by means of a glass member which acts as a stop for the transducer for all forces in excess of a rated force which causes a maximum diaphragm deflection relatively equal to the depth of said depression. U.S. Pat. No. 3,930,823 issued on January 6, 1976 to A. D. Kurtz et al. and is entitled "A High Temperature Transducer and Housing Including Fabrication Methods". This patent shows a dielectrically isolated pressure transducer which includes a silicon diaphragm having on a surface at least one piezoresistor sensor mounted in close proximity with a dielectric insulator. The diaphragm is secured about a nonactive peripheral area to an annular ring housing by a glass bond fabricated from a glass material having a low melting temperature when compared to ordinary glass.

As one can see from these patents and various other patents, there is a constant desire to improve the operation of the piezoresistive transducer and to further create a device which is reliable and economical. Thus, according to this invention, there will be described a technique for producing an integral transducer which technique involves the selective diffusion of highly doped semiconductor material to produce the main features of the transducer structure. By utilizing this technique, many great advantages can be obtained over transducers as existing in the prior art, while the resulting transducer further possesses great versatility in regard to accommodating many different modes of operation and structures. The device is simple to construct and provides a very powerful transducer exhibiting improved performance and operation.

The device to be described is fabricated by means of diffusion and selective etching and employs similar techniques as described in a copending application entitled "Fabrication of Dielectrically Isolated Fine Line Transducers and Apparatus", Ser. No. 804,761, filed on Dec. 5, 1985 for A. D. Kurtz et al. and assigned to the assignee herein.

The device to be described provides a raised peripheral flange which is fabricated on a sacrificial wafer and is dielectrically isolated from a piezoresistive pattern of high conductivity semiconductor fabricated from the same sacrificial wafer. The raised peripheral flange enables one to bond a thick sheet of glass over the pattern, thus covering the same. The device gives one the ability to make a hermetically sealed unit with total isolation, while further providing a stop for the unit and dielectrically isolated contact areas. The structures so resulting are then bonded to a carrier wafer to complete the transducer structure.

BRIEF DESCRIPTION OF THE PREFERRED EMBODIMENT

A single crystal transducer structure comprising a first carrier wafer of single crystal semiconductor material of a given conductivity having a dielectric layer on a top surface including a layer of glass and having bonded to said glass layer highly doped varying height transducer elements, which are formed from a second sacrificial wafer of semiconductor single crystal material.

DETAILED DESCRIPTION OF THE FIGURES

Figure 1:
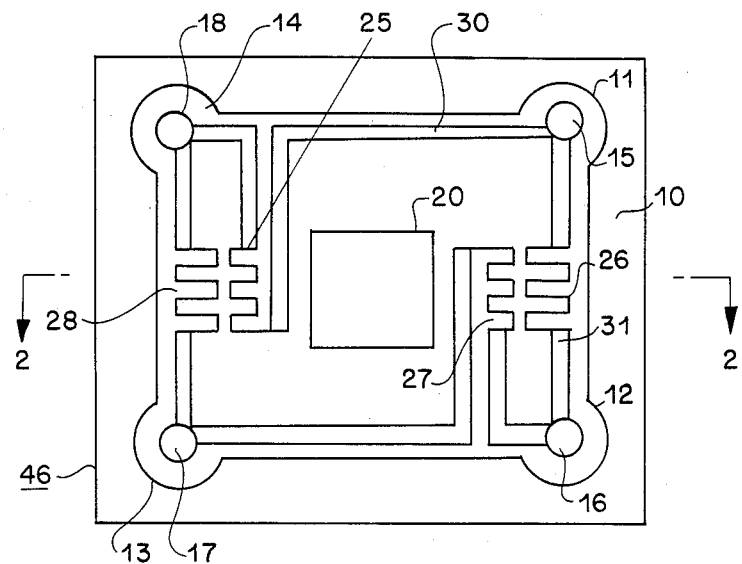
FIG. 1 is a top plan view of a transducer structure according to this invention.

Referring to FIG. 1, there is shown a top plan view of a semiconductor transducer according to this invention. It is noted at the onset that the configuration of the transducer is relatively unique. Essentially, the transducer consists of a single semiconductor material including many surface features which are formed by common processing. As shown in FIG. 1, the device is characterized by having an extending peripheral flange 10 which essentially surrounds the entire inside structure. The peripheral flange 10, as will be explained, is fabricated from a P+ layer which is selectively diffused in an N-type silicon wafer. The N-type silicon wafer 46 will be subsequently referred to as a sacrificial wafer. The peripheral flange 10 is formed by a diffusion technique and as will be explained the length of time of diffusion can produce different depth P+ layers which essentially form the entire transducer structure. As seen in FIG. 1, the peripheral flange 10 has four partial apertures as 11 to 14 formed in each corner of the device. These partial apertures are formed during the process and essentially each aperture, as 11, partially encircles an upstanding cylindrical member, as 15, associated with aperture 11, 16, as associated with aperture 12, and so on. It should be noted that the purpose of the partial apertures or spaces is to electrically isolate the peripheral flange from the contacts and sensor resistors. The upstanding cylindrical members, as member 15, are solid members and essentially serve to allow one to make contact to the piezoresistive sensor configuration also formed by the diffusion technique employed in this invention. Also shown is a central boss 20. It is understood at the onset that the boss 20 is not necessary for providing a complete transducer but when required is fabricated by the same process. The boss 20, serves as a stop for the completed transducer structure. The semiconductor piezoresistive elements are also shown in FIG. 1 and essentially comprise four elements as 25 to 28. The elements are piezoresistors which are fabricated during the diffusion technique and also consist of highly doped areas. Each element has a conductive lead directed from the element to an associated upstanding cylindrical contact area which is a wider area of diffused material formed at the same time. Each piezoresistor consists of a thin line width section aligned properly in the strain field and a wider region of material leading to contact lands. These are as previously stated electrically isolated from the flange. Thus, as shown in FIG. 1, there is an electrical connection 30 which connects one terminal of element 25 to the upstanding cylindrical member 15 which is associated with the corner semi-aperture 11. In a similar manner, other terminal areas are directed to associated upstanding cylindrical members by means of the connections such as 31, which is directed from element 26 to cylindrical member or contact area 16. Essentially the entire structure depicted in FIG. 1 is formed by utilizing highly doped diffusion in silicon. In this manner one fabricates P+ layers in an N-type silicon wafer and based on the diffusion techniques and the length of time of diffusion, these P+ layers can be accommodated to any given depth. Thus, a transducer structure can be formed by selective diffusion and allowing the diffusion to be accommodated over a given length of time. This controlled diffusion process results in P+ surface features of various heights. The entire process will be further explained.

Figure 2:
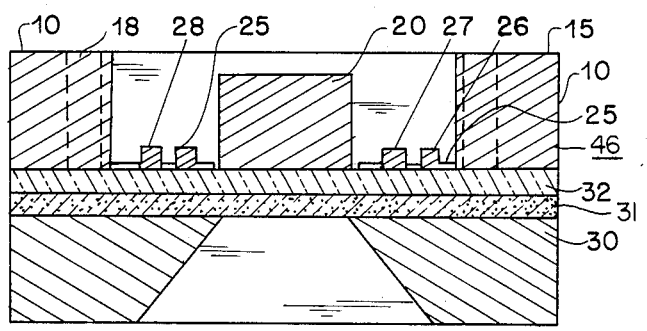
FIG. 2 is a cross-sectional view of the transducer according to this invention.

Referring to FIG. 2, there is shown a cross-sectional view of the transducer depicted in FIG. 1. As will be further explained, in FIG. 2 there is shown a bottom carrier wafer 30. Essentially the carrier wafer consists of a wafer of semiconductor material which is silicon and which is coated with silicon dioxide thereby forming a thin layer of silicon dioxide 31. Onto the layer of silicon dioxide is deposited a layer of glass 32, such as a Pyrex glass. This structure forms the carrier wafer 30. Secured to the carrier wafer 30 is the basic transducer structure formed on the sacrificial wafer 46 and consisting of different height P+ diffused areas. Hence as shown the peripheral ridge 10 is intimately secured to the glass layer 32. Also shown is the central boss 20 which is also secured to the thin glass layer 32. The piezoresistive sensors, as 26 and 28, are also secured to the thin glass layer 32. Thus, as seen in FIG. 2 the sensor elements, as 26 and 28, are dielectrically isolated from the carrier wafer by means of the glass layer 32 and the thin oxide layer 31 and from the peripheral flange. As will be explained, the process of forming the transducer structure utilizes the sacrificial wafer 26. The sacrificial wafer 26 has diffused on the surface a series of highly doped areas. These highly doped areas can be controlled so that they are diffused to different depths. Thus, the same diffusion process is utilized to form the peripheral ridge 10, the cylindrical contact areas 15, 16, 17 and 18, the central boss 20, as well as the piezoresistive sensors 26 and 28. The piezoresistive sensors, as 28 and 26, are connected to these contact areas by means of the wider diffused paths as 30, 31 and so on. The sacrificial wafer 46, which essentially forms the main body of the transducer, is secured to the carrier wafer 30 by means of an electrostatic bond whereby the surface diffused with the P+ regions is secured to the carrier wafer 30 by means of the glass layer 32. The lower conductivity portions of silicon on the sacrificial wafer are then removed by utilizing a selective conductivity etch, as will be explained, thus leaving different height P+ regions. In general the deep diffusions are used to obtain the surface features and the shallow diffusion to obtain the strain sensing resistors as 26 and 28. This will be further explained.

Figure 3:
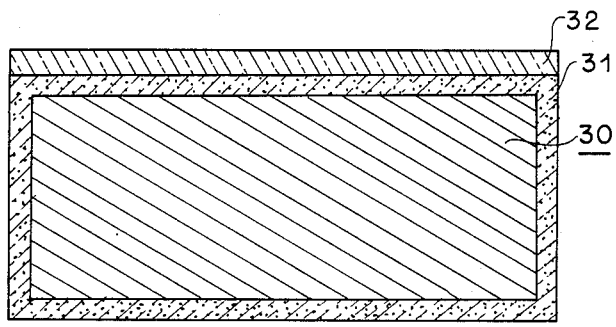
FIG. 3 is a cross-sectional view of the carrier wafer employed in this invention.

Referring to FIG. 3, there is shown a cross-sectional view of a treated carrier wafer 30. The original wafer 30 is fabricated from a semiconductor material such as N-type silicon and is preferably a single crystal structure. The wafer 10 may be circular or rectangular in the top plan view. Essentially, as shown in FIG. 1, the completed transducer is rectangular or square in configuration but it is of course understood that the techniques described herein are applicable for any geometrical shape. Such wafers are commercially available and are well known in the art. The wafer 30 may be approximately 2 to 5 inches in diameter and approximately 3 to 10 mils in thickness. Hence, as one can determine, the wafer is relatively thin. According to one method to be described, the wafer 10 is treated so that a layer of silicon dioxide is grown on all surfaces of the wafer. The growth of such layers of silicon dioxide is well known in the art and is described in many typical references. The typical technique for providing a layer of silicon dioxide is implemented by heating the wafer 30 to a temperature of between 1000° to 1300° C. and passing oxygen or steam over the surface for growing the layer of silicon dioxide. The layer of silicon dioxide is designated by reference numeral 31. After growing the layer of silicon dioxide on the semiconductor wafer 30, a thin layer of glass which may be 1 mil or less, such as a Pyrex glass, is then sputtered, deposited or otherwise formed on the top surface of the wafer 30. The glass layer, as well as the oxide layer 31 serve to provide dielectric isolation between the sensors and the remaining structure. Essentially the thin glass layer 32 allows one to make the necessary bond or seal to the sacrificial wafer. Both layers 31 and 32 act as one dielectric isolating layer with this function being primarily performed by the layer 31 of silicon dioxide. The techniques of using sacrificial and carrier wafers have been described in a co-pending application entitled "Fabrication of Dielectrically Isolated Fine Line Semiconductor Transducers and Apparatus", filed on Dec. 5, 1985 as Ser. No. 804,761 for A. D. Kurtz et al, and assigned to the assignee herein. The techniques described in that application are applicable to the structures described in this application.

Figure 4:
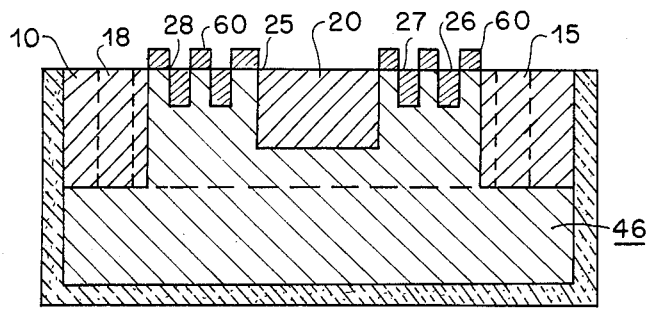
FIG. 4 is a cross-sectional view of a sacrificial wafer utilized to form the transducer.

Referring to FIG. 4, there is essentially shown the sacrificial wafer 46. The sacrificial wafer 46 may be fabricated from N-type silicon which is single crystal of whatever crystal orientation is most useful for the particular transducer application envisaged. It should be noted that the choice of crystal orientation of the carrier wafer is independent of that of the sacrificial wafer. Basically, the sacrificial wafer 46 may be circular or rectangular in the top plan view. As indicated above, such wafers are commercially available as for example is the carrier wafer and well known in the art. Sacrificial wafer 46 may be approximately 3 to 5 inches in diameter and approximately 3 to 10 mils in thickness and essentially is of the same size as the carrier wafer 30 as shown in FIG. 3. The sacrificial wafer is treated by conventional techniques so that the various elements as shown in FIG. 1 which essentially are the surface features, namely, the peripheral ridge 10, the upstanding cylindrical members as 15 and 18, the central boss 20 as well as the piezoresistors 26 and 28 are fabricated by the use of P-type diffusion which is accommodated by using high concentration P-type impurities. Those regions are formed by highly doped-layers in the N-type semiconductor sacrificial wafer. The techniques for providing high doping are well known. In order to produce highly doped P-type layers, one uses a diffusion technique which employs high boron concentration to produce a highly doped P-layer or a P+ region. The pattern which defines this semiconductor region is determined by masking techniques. Such techniques have been described in great detail in the above-noted co-pending application. For example, the sacrificial wafer 46 has grown on the top surface a thin layer of silicon dioxide. It is well known to use a layer of silicon dioxide to allow one to diffuse various impurities into a sacrificial wafer as wafer 46. This is accommodated by the formation of a semiconductor pattern which is implemented by the use of photomasks and photochemical or photolithograhic techniques. Briefly, the use of such techniques is also well known in the semiconductor art and involves the use of a photo resist or a lacquer which is coated over the oxide layer. The thickness of the photoresist may be on the order of several thousand Angstroms. The photoresist, having the desired pattern impressed upon it, is then exposed to ultraviolet light which causes the photoresist to harden according to the pattern on the mask. These techniques are well known. Once the pattern is impressed, windows are formed via the photoresist pattern. The N-type sacrificial wafer 46 has the various surface patterns diffused via the openings in the silicon dioxide layer. As indicated, this is accommodated by a P-type diffusion. Essentially, the P-type diffusion uses high concentration P-type impurities. The formation of such highly doped P-type layers, is accommodated by using a diffusion technique utilizing boron concentration to produce a highly doped P-layer or P+ region. Thus, each of the regions as 10, 15–18, 20, 26 and 28 are formed by high boron concentration doping. The entire structure is formed from a plurality of masks as will be explained. Each of the patterns formed can be accurately controlled due to the advances made in the diffusion process. Based on the diffusion process, which results in highly doped P-layers, one achieves a very small temperature coefficient for the final device. The P regions are designated on FIG. 4 as P+ regions and are shown as buried regions within the N-type material of the sacrificial wafer 26. The dashed line in FIG. 4 depicts the maximum depth to which the diffusion is accommodated. It is thus seen that the height of the peripheral flange 10 as well as the upstanding cylindrical members as 15 or 18 are diffused to the greatest depth. The height of the flange 10 and the cylindrical contact areas as 15–18 are the same, and hence the top surfaces lie in the same plane. The boss 20 (if desired) may be of a lesser height than the peripheral flange 10 while the piezoresistive pattern as piezoresistors 25 to 28 are still of a lesser height.

Figure 5A:
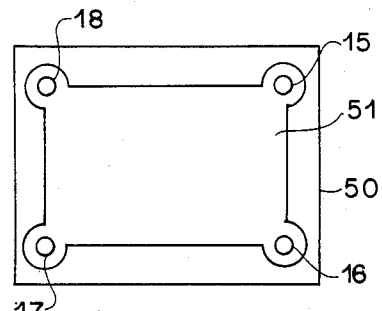
FIGS. 5A-5C are a series of diagrams of a wafer useful in explaining the method of fabricating the transducer.
Figure 5B:
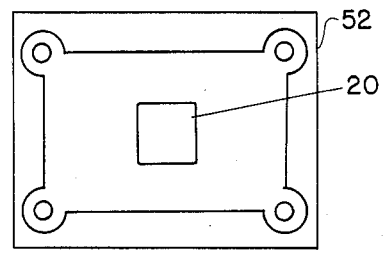
Figure 5C:
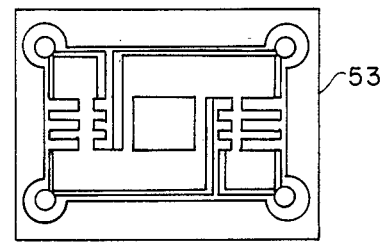

Referring to FIG. 5, there is shown a series of steps implemented in fabricating a sacrificial wafer 46. Referring to FIG. 5A, according to this technique a first mask is employed to begin the diffusion process after the wafer 46 has been coated with a thin layer of silicon dioxide or silicon nitride. A first mask is then impressed upon the wafer 46 to produce areas as 51. The area 51 defines a diffusion mask which essentially determines the peripheral flange 10 as well as the upstanding cylindrical members as 15 and 18. After a given time, the diffusion process is interrupted. Referring to FIG. 5B, a second mask is then employed as shown by reference numeral 52. This mask, for example, will open a hole in the oxide or nitride layer to begin diffusion of the central boss or stop member 20 if such a stop number is desired to be used with the transducer configuration. The second mask also contains the pattern of the first mask to allow the diffusion process to continue for the flange and the cylindrical member and to start the diffusion of the boss or stop 20. Hence, an aperture is opened in the oxide or nitride layer after a predetermined length of time has occurred which then causes the diffusion to form the central boss 20. The remaining time for the diffusion process will therefore complete the peripheral flange, the upstanding cylindrical members as well as the boss. Thus, as can be seen, during the diffusion process, when the flange is formed to the correct depth, then the boss is also at the proper depth. As the diffusion process continues, a third mask (FIG. 5C) is then provided which mask defines the sensor network associated with the transducer structure as implemented on the sacrificial wafer. Thus, as indicated by reference numeral 53, once the diffusion process continues, a third mask is now utilized to open the oxide or nitride layer and to diffuse into the sacrificial semiconductor material the sensor network and the connections to the cylindrical terminal areas. Thus, as seen from FIGS. 5A–5C, one obtains a sacrificial wafer which essentially has a cross-sectional configuration as shown in FIG. 4. It is understood that the number of masks to implement the device may be more then shown but the general concept should be clear. Referring to FIG. 4 there is shown the P+ regions as region 10 which is the peripheral flange, regions 26 and 28 which are the diffused piezoresistive patterns, region 20 which is the central boss area. It is also shown in FIG. 4 that there is a oxide or nitride layer as layer 60 which remains due to the processing of the structure as briefly described in conjunction with FIG. 5.

Figure 6:
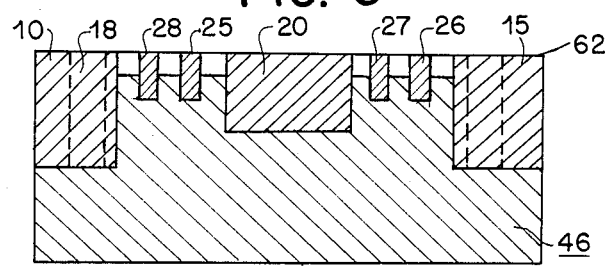
FIG. 6 is a cross-sectional view of one step in processing a sacrificial wafer.

Referring to FIG. 6, the next step in the procedure is depicted. After formation of the different depths, highly doped P+ regions, the oxide layer 60 is removed and the lower conductivity N-type silicon which is the remaining material of the sacrificial wafer is then etched at the top to reduce the thickness at the top surface. This etching is done by a conductivity selective etch. Such etches are well known and there are etchants such as hydrazine which selectively attacks the low conductivity N-type material without etching or in any manner attacking the high conductivity P+ layers. Techniques for etching silicon are well known in the art. See, for example, a series of papers published in the IEEE Transactions on Electron Devices, October 1978, Vol. Ed.-25. See also U.S. Pat. No. 4,204,185 entitled Integral Transducer Assemblies Employing Thin Homogeneous Diaphragms issued on May 20, 1980 to A. D. Kurtz et al. and assigned to the assignee herein. Thus, as shown in FIG. 6, the material from the N-type wafer is etched to about one-half the depth of the diffusion of the piezoresistor regions 26 and 28 to thereby produce the structure shown in FIG. 6. Hence, as discerned from FIG. 6, it is immediately apparent that there exists a raised pattern on the sacrificial wafer 26. This pattern consists of projecting P+ regions which have been previously diffused into the sacrificial wafer 30. It is of course apparent that the top surfaces of all of the regions as 10, 28, 26 are at the same level as evidenced by line 62 of FIG. 6 due to the diffusion into the same surface of the sacrificial wafer 46.

Figure 7:
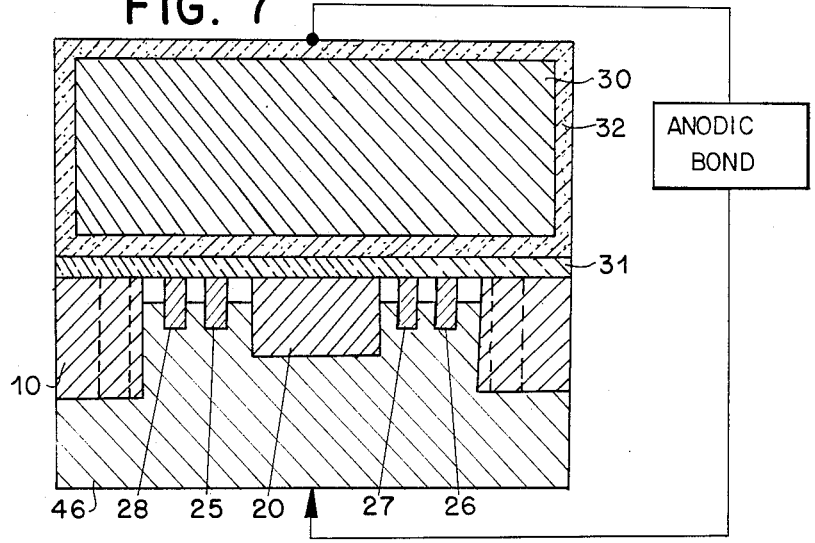
FIG. 7 is a cross-sectional view showing the bonding of a carrier wafer to a sacrificial wafer.
Figure 8:
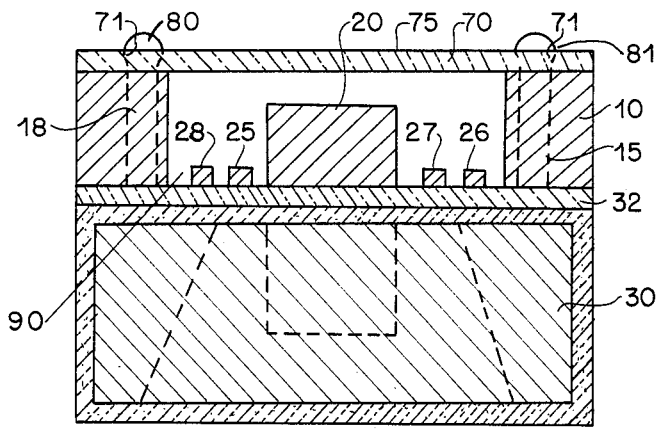
FIG. 8 is a cross-sectional view of a transducer structure according to this invention.

Referring to FIG. 7 it is shown that the treated sacrificial wafer 26 is then secured to the glass layer 31 of the carrier wafer 30. This is accomplished by means of an electrostatic bonding technique. Such bonding techniques are well known. For example, see U.S. Pat. No. 4,040,172 entitled Method of Manufacturing Integral Transducer Assemblies Applying Built-In Pressure Limiting issued on Aug. 9, 1977 to A. D. Kurtz et al. and assigned to the assignee herein. The bond, whether it be deemed an anodic or an electrostatic bond is formed by applying an electric current through the composite structure under low pressure and low heat (about 300° C.) thus bonding the raised P+ regions to the glass layer 31 of the carrier wafer 10. After the bonding occurs which is shown in FIG. 7, the next step is to remove the low conductivity N material from the sacrificial wafer by utilizing an etching bath whereby the low conductivity N regions are etched away. The etching of low conductivity type silicon is well known. There are many etchants which will attack the N-type layer without attacking the high doped P+ layers. A typical etchant includes hydrazine as well as other materials. As one can see from FIG. 8, the remaining structure comprises a highly doped pattern which consists of the outer peripheral flange, the sensor array and the extending stop boss. It is of course understood that the boss need not be fabricated but as explained above, is a desirable feature for many transducers. As one can see from FIG. 8, and as one can ascertain from the above description, once the N regions of the sacrificial wafer are etched away, one now has a sensor array as sensors 25 to 28 located on a glass substrate 31 which glass substrate appears over a layer of silicon dioxide 32. Hence, all the structures as the sensors 25 to 28 as well as the boss 20 with the peripheral flange 10 are dielectrically isolated one from the other in this particular structure. The procedure also makes electrical connections between the sensor array and the upstanding cylindrical members as 15 to 18. This is done suring the diffusion technique whereby P+ electrical leads as 30 and 31 of FIG. 1 are diffused by use of the mask thus connecting the individual sensors in the array to the cylindrical contact areas as 15 to 18. It should be noted that the wide, deeply diffused regions leading from the sensor network to the upstanding cylindrical members can be used for another purpose. Since they are electrically in series with the respective bridge arms of the sensor network they can be individually trimmed to obtain a better bridge balance for the sensors if they (the sensors) are to be connected electrically to form a Wheatstone Bridge. It is well known in previous art that it is difficult to match the resistance of the individual sensor arms as closely as is often desired for precise measurements. Other patents have illustrated various means of overcoming this problem by adding resistors having the same temperature coefficient of resistance as the sensors in series with individual sensor arms, this served to balance the Wheatstone Bridge without introducing thermal errors. See U.S. Pat. No. 4,333,349 entitled Balancing Apparatus for Semiconductor Transducer Structures issued on June 8, 1982. In the present invention, there exists a much simpler technique for effecting the same goal. By coating or covering the contact leads with metal to completely short out any resistance in the bridge arms and then partially removing a portion of the metal, the resistance of each arm may be continuously varied to obtain the best bridge balance. This may be implemented by use of a laser to selectively evaporate some of the shorting metal. It should further be noted that the contact lead areas are not only wider, but significantly thicker than the sensor resistors (4 to 5 times) and hence can be trimmed by this technique to a greater accuracy than by previous teaching. Also shown in FIG. 8 is the fact that the entire transducer structure can now be capped or topped with a thick glass sheet as 70. The glass sheet 70 is typically much thicker than shown in proportion to the thickness of the semiconductor material. The glass sheet 70 contains apertures as 71 and 72 which apertures are aligned with each of the upstanding cylindrical members as 15, 18, 16 and 17. This consists of a transducer structure which consists of a piezoresistive sensor bridge connected via the diffused contact leads to the cylindrical members and which has a peripheral flange capped with a glass sheet. All the above elements are dielectrically isolated from one another. In this manner, one can now direct a lead or metallize through the apertures 71 to contact the upstanding cylindrical members and thereby make contact with the sensor array. If the apertures 71 in the glass sheet are less in diameter than the diameter of the upstanding cylindrical members, one provides a bond around the peripheral edges of the cylindrical members. If the apertures in the glass sheet are tapered, then one must only insure that the bottom or exit hole of the aperture that is in contact with the upstanding cylindrical member be smaller in diameter than the cylindrical member. In this way, one can provide means of metallizing the inside of the aperture and inserting a ball or pin in the relatively wider top portion of the aperture thus making for a cheaper, more reliable means of contact. It should also be apparent that by metallizing the cover glass appropriately, an interconnected array or matrix of sensors could be so formed. It is noted that the cylindrical members being P+ material are conductive as are the diffused connecting areas as 25 and 31 to thus allow ohmic contact to be made between the piezoresistive array and the cylindrical members. As one can see, the areas such as 80 and 81 also allow one now to connect leads to the same so that they can be directed to a suitable biasing source or monitoring instrument. It is of course seen that once the glass sheet 70 is in place and electrostatically bonded to the peripheral flange, one can also achieve a complete hermetic seal. The boss 20, of a lesser height then the flange operates as a stop to impinge upon the glass sheet 70 for excessive forces applied via the boss in the carrier wafer. In any event, the boss 20 can be of the same height as the flange and the glass sheet 72 be etched to form a depression 75 (shown dashed) which together with the boss 20 operates as a stop. Thus, if the process is conducted in a vacuum, the internal hollow as hollow 90 of the sensor array is in vacuum. In this manner, one easily obtains a hermetic seal and makes an absolute pressure transducer. It is further noted that if gage pressure operation is desired, then one can also form apertures in the center of the glass sheet to allow air to escape and so on. As seen from FIG. 8, the original carrier wafer which is wafer 30 can now be etched to form a suitable aperture which is shown in dashed line in FIG. 8 to enable one to thus form an active area or a diaphragm portion for the sensor. Such an aperture can either be basically flat or shaped by appropriate patterning and etching to form the thin deflecting portion of the diaphragm. Various examples of uniform structures are shown in U.S. Pat. No. 3,739,315 entitled Semiconductor Transducers Having H-Shaped Cross-Section Configurations issued on June 12, 1973, while patterned structures are shown in U.S. Pat. No. 4,236,137 entitled Semiconductor Transducers Employing Flexure Frames issued on Nov. 25, 1980. Both patents are assigned to the assignee herein. In a similar manner as is shown in dashed line, the carrier wafer 30 can further be treated so as to produce an aperture having a raised central boss. In this manner, point loads can be applied to the central boss of the carrier wafer to provide a force concentrating means for the transducer structure. The central regions of such patterned structures can act as bosses for stopping or stress concentration in the thin members of the resulting diagram structure. It is apparent that a second piece of thick glass can now be secured to the back portion of the carrier wafer if so desired. The resulting structure could then act as a bidirectional relatively symmetric pressure sensor with both surfaces of the transducer structure secured to thick glass substrates. In addition, if the central boss on the carrier wafer is slightly depressed with respect to its peripheral section, the depressed boss will act as a stop when the carrier wafer is secured to the second glass substrate, thus insuring a bidirectional stop, together with the boss on the sacrificial wafer.

From the foregoing, it is apparent that many new, novel and heretofore, unobtainable structures can be obtained from the basic concepts disclosed herein without departing from the spirit and ideas of this invention. In particular, this invention enables the transducer designer to use both a single crystal sensor or sacrificial wafer of the most preferred crystallographic orientation, a shaped cover glass over the sensor network, a carrier wafer of the preferred crystallographic orientation, as well as a second cover glass. Thus, this construction gives a heretofore unobtainable flexibility in overall transducer design. Thus, the carrier wafer would then be treated as etched or otherwise to form various transducer structures as for example shown in FIGS. 9, 10 and 11. Also mentioned in the copending application, when one diffuses P+ regions into a semiconductor wafer based on the diffusion process, the top surface of the P+ region may appear to be slightly concave. Hence, as one can ascertain when the raised P+ regions are placed in contact with the glass layer of the carrier wafer, adhesion may occur only at a portion of the P+ region since the center portion is slightly depressed. In order to avoid this problem, the sacrificial wafer would be first treated to form a layer of silicon nitride on a surface. The layer of silicon nitride may be 2,000 angstroms thick. On top of the layer of silicon nitride, one then deposits a layer of silicon dioxide. The subsequent oxidation may give a layer of silicon dioxide of between 6,000 to 12,000 angstroms thick. It is noted that both the growth or deposition of silicon nitride and silicon dioxide are well known. It is also known that there are etches which will attack silicon dioxide and will not attack the silicon nitride and vice versa. For example, one can utilize a buffered solution of hydrogen fluoride (HF) for attacking silicon dioxide and utilize a mask which is KPR to prevent etching of any pattern in the silicon dioxide. Alternatively, one employs phosphoric acid for silicon nitride as an etchant using the mask of silicon dioxide. Thus the phosphoric acid will attack the silicon nitride, but will not attack the silicon dioxide. The buffered HF solution will attack the silicon dioxide but will not attack the silicon nitride. A layer of photoresist is then deposited on top of the layer of silicon dioxide. The layer of photoresist is now patterned to form the required structure to be employed. This is done as above by conventional photolithographic techniques and is well known. Thus, the resultant pattern can be formed after etching away the unwanted silicon dioxide. Hence, the pattern which consists of the photo resist deposited or otherwise bonded to the remaining portion of the layer of silicon dioxide is one of the desired transducer patterns. The photoresist is now stripped leaving a layer of silicon dioxide secured to the layer of silicon nitride. The nitride is then patterned based on using the silicon dioxide layer as a mask thus arriving at the pattern which consists of a layer of silicon nitride secured to the surface of the semiconductor wafer. The next step in the procedure is to now remove all the oxide and then thermally grow an additional oxide coating to cover the entire silicon wafer. It is noted that the oxide will not grow on the silicon nitride areas. The layer of silicon nitride is depressed with respect to the oxide surface after the step of thermally growing. The thermally grown layer of silicon dioxide reduces the effective height of the wafer.

The next step in the procedure is to remove the layer of silicon nitride and to diffuse into the resulting apertures P+ regions using boron with the oxide acting as the mask. After the diffusion technique, the layer of oxide is removed thus resulting in the desired structure. The structure again will have raised projecting areas of P+ diffusion which areas have a flat top surface and hence, can be more readily electrostatically or anodically bonded to the carrier wafer. This process is described in the copending application entitled "Fabrication of Dielectrically Isolated Fine Line Transducers and Apparatus," Ser. No. 804,761. Thus, as one can see there are various approaches which can be had to form the transducer structure basically shown in FIG. 8. It is this structure which is of paramount importance. The reason why this structure is extremely important is one can now provide a transducer which, for example, can be hermetically sealed, can have a stop member and exhibits complete dielectric isolation between the transducer assembly and all other parts of the transducer. Essentially the structure is unique in that it consists of a peripheral flange 10 which flange is secured to a composite dielectric layer consisting of a top layer of glass and a bottom layer of silicon dioxide. The flange surrounds piezoresistive array which is also dielectrically isolated and which also exists on the composite layer associated with the carrier layer. There may be a stop member as a central boss 20 which again in turn is dielectrically isolated from all other surface features of the transducer. The transducer structure contains upstanding cylindrical members, each of which is positioned in a corner aperture of the transducer assembly which members are also dielectrically isolated from the remaining structure. These upstanding members provide contact areas to enable one to therefore cap the entire structure with a thick glass sheet having apertures corresponding to the location of the cylindrical members as at the corners for directing leads to the upstanding members. Thus, it can be seen that the transducer is capable of providing many different configurations and having all of the advantages as indicated above.

Hence to implement the transducer structure, the order of masking and diffusion is such that first one provides a mask which is indicative of the peripheral flange and the cylindrical contact members, then after a predetermined diffusion time one opens a hole via a second mask which includes the central boss, the diffusion of P+ impurities continues assuring that the flange and the cylindrical members will be of a greater height than the boss. After another predetermined time, a third mask indicative of the sensor pattern and electrical connectors is employed to allow the sensors and leads to be diffused to still a lesser height, whereby when the diffusion process is completed, the entire sacrificial wafer is formed having the different depth P+ regions. The treated surface is then bonded to the glass layer of the carrier wafer and then the low conductivity excess material of the sacrificial wafer is removed providing the required structure.

The carrier wafer may then be further treated to provide a suitable aperture for providing an active diaphragm area or treated to provide a bossed area for receiving an applied force. The top surface of the formed sacrificial wafer may then be coated with a thin layer of glass or oxide to protect the sensor pattern. A thick glass sheet having apertures is then electrostatically bonded to the top surface of the treated sacrificial wafer, with the apertures in the glass sheet allowing one to either metallize to provide terminal contacts to the sensor pattern or to insert leads through the apertures to contact the sensor pattern.

Figure 9:
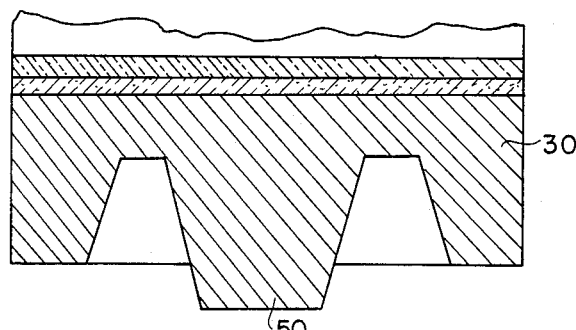
FIG. 9 is a cross-sectional view of a carrier wafer having a projecting boss.
Figure 10:
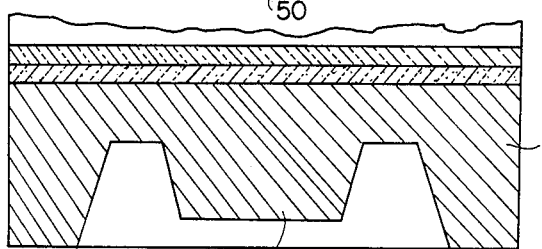
FIG. 10 is a cross-sectional view of a carrier wafer having a recessed boss.

As one can ascertain from FIG. 9, there is shown a diagram of the carrier wafer which has a unique boss formed thereon. Essentially, the boss on the carrier wafer can be formed as shown in FIG. 9 or FIG. 10. In FIG. 9, there is a protruding boss which is formed by selectively etching the carrier wafer. This protruding boss as boss 50 allows one to fabricate load or force sensors. Essentially as shown, the process is completed on the carrier wafer by etching the flange and leaving the boss extending therefrom.

In FIG. 10, the boss is recessed with respect to the side flanges associated with the carrier wafer 30. This transducer configuration can be used for pressure applications and later used as a predetermined stop for the sensor. In this technique, the boss 51 is etched instead of the flange.

Figure 11:
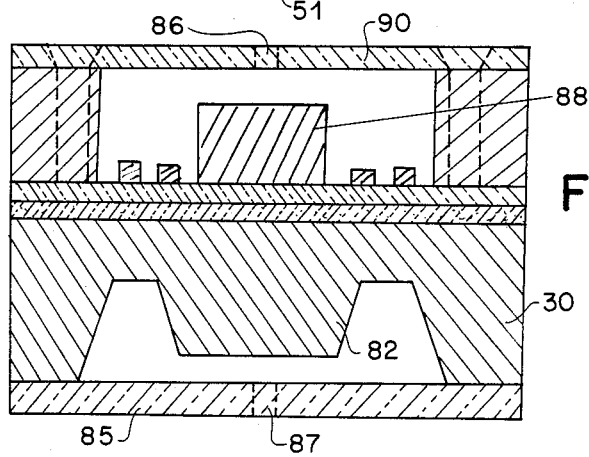
FIG. 11 is a cross-sectional view of a transducer assembly employing a bidirectional stop mechanism.

Referring to FIG. 11, there is shown a double stop transducer. Essentially, the transducer consists of a sacrificial wafer which as described above is capped with a top sheet of glass 90. Also shown in FIG. 11 is the fact that the apertures in the glass sheet 90 are tapered and of a "V" cross section and hence are filled with a metal or other conducting substance to provide contact areas. The metal extends above the glass sheet to form a terminal contact area. In this manner, the extending metal areas can contact terminals for connecting the transducer in circuit. It is also apparent that the metal need not extend above the glass sheet and can be lower to form recessed terminal contact areas. The carrier wafer 30 is shown having a recessed boss 82. The flanges of the carrier wafer are also electrostatically bonded to a thick sheet of glass 85. Both glass sheets as 90 and 85 have central apertures 86 and 87 to allow air to escape. Thus as one can see from FIG. 11, there is shown a double stop transducer assembly whereby the boss 82 will impinge upon the surface of the glass sheet 85 to limit forces applied in a first direction and whereas the boss 88 will impinge upon the surface of the glass sheet 90 to limit forces applied in the opposite direction. Thus, the configuration depicted in FIG. 11 is unique and is not shown in any other prior art reference. It is of course understood that based on the selective etching technique as described above, there are virtually many applications for providing unique transducer structures which have not been fabricated or implemented by the prior art. It is the method as well as the apparatus shown in this application which enables one to produce a wide range of varying transducer structures, each having extreme versatility, each differing from any of those depicted in the prior art.

In view of the above specification, the applicant hereby presents the following claims. It is understood that there are many alternative structures and modifications which can be implemented using the above described techniques and all of these are deemed to be encompassed within the spirit and scope of this invention.

What is claimed is:

1. A semiconductor structure for use in a transducer comprising:
a first wafer of single semiconductor material of a given conductivity having a dielectric layer on a top surface including a layer of glass and having bonded to said glass layer highly doped varying height transducer elements dielectrically isolated one from the other including a piezoresistive sensor element surrounded by a higher peripheral flange element both of which are formed from a common wafer of semiconductor material and both of which are of higher conductivity than that of said first wafer wherein said peripheral flange has at least one partial aperture located on the inner surface and facing said sensor element, with an upstanding cylindrical member bonded to said glass layer and of a height equal to the height of said flange also formed from said common wafer of semiconductor material and of the same conductivity as said sensor and peripheral flange, and with at least one terminal of said piezoresistive element electrically connected to said cylindrical member, said cylindrical member and said piezoresistive sensor element electrically isolated from said flange.

2. The semiconductor transducer structure according to claim 1, further comprising a central boss bonded to said glass layer and of a height less than the height of said peripheral flange, said boss also formed from a common wafer of semiconductor material and of the same conductivity as said sensor and peripheral flange.

3. The semiconductor transducer structure according to claim 2, further including a glass sheet positioned on the top of said peripheral flange to thereby cover said piezoresistive element and having an aperture overlying said cylindrical member to allow contact to be made with said cylindrical member.

4. The semiconductor transducer structure according to claim 3, wherein said glass sheet is electrostatically bonded to said peripheral flange.

5. The semiconductor structure according to claim 3, wherein said glass sheet is electrostatically bonded to said cylindrical member.

6. The semiconductor transducer structure according to claim 1, wherein said first wafer of semiconductor material has an aperture located on a bottom surface and of a configuration to form a deflection area for said piezoresistive element.

7. The semiconductor transducer structure according to claim 1, wherein said dielectric layer is a composite layer comprising a first layer of a semiconductor oxide coating on said top surface with said layer of glass coating said oxide coating.

8. The semiconductor transducer structure according to claim 1, wherein said glass layer is a Pyrex glass layer.

9. The semiconductor transducer structure according to claim 1, wherein said first wafer of semiconductor material is of N-type semiconductor material of a low conductivity with said highly doped, varying height structures being of P+ semiconductor material.

10. The semiconductor transducer structure according to claim 1, wherein both said first wafer and said transducer elements are single crystal silicon.

11. A semiconductor transducer structure, comprising:
a first carrier semiconductor wafer having a top composite surface including a first layer of an insulating silicon compound with a layer of glass disposed on said silicon compound, with a bottom surface having an aperture extending towards said top composite surface and defining an active diaphragm area,
a peripheral flange located on said top surface of said carrier wafer and bonded to said glass layer, said peripheral flange including at least one partial aperture formed on the inside wall of said flange,
at least one upstanding cylindrical member located on said top surface of said carrier wafer and bonded to said glass layer, with said member located within said aperture and partially surrounded thereby, with the height of said member relatively equal to the height of said peripheral flange,
at least one piezoresistive element positioned on said top surface of said carrier wafer and bonded to said glass layer and overlying said aperture in said bottom surface of said carrier wafer, with an electrical connection coupling said piezoresistive element to said cylindrical member.

12. A semiconductor transducer structure according to claim 11, further including:
a thick glass sheet electrostatically bonded to said peripheral flange and having an aperture overlying said upstanding cylindrical member with a lead directed through said aperture to enable a connection to be made to said upstanding cylindrical member.

13. The semiconductor transducer structure according to claim 11, further including a central boss member located on said top surface of said carrier wafer and bonded to said glass layer with the height of said boss member less than the height of said peripheral flange but greater than the height of said piezoresistive element.

14. The semiconductor transducer structure according to claim 11, wherein said peripheral flange, said cylindrical member and said piezoresistive element are all fabricated from highly doped semiconductor material obtained from diffusing a silicon wafer with applicable regions and corresponding to said flange, cylinder member and said element.

15. A semiconductor transducer structure comprising a first carrier wafer of a single crystal semiconductor material of a given conductivity having a dielectric layer on a top surface including a layer of glass and having bonded to said glass layer highly doped varying height transducer elements, which are formed from a second sacrificial wafer of single crystal semiconductor material.

16. The semiconductor transducer structure according to claim 15, wherein said varying height transducer elements include a first peripheral flange of a given height and surrounding at least one sensor element of a different height both formed from the same wafer.

17. The semiconductor transducer structure according to claim 16, wherein said peripheral flange has at least one partial aperture located on the inner surface and facing said sensor element, with an upstanding cylindrical member bonded to said glass layer of a height equal to the height of said flange also formed from said common wafer of semiconductor material and of the same conductivity as said sensor and peripheral flange, with at least one terminal of said sensor element connected to said cylindrical member.

18. The semiconductor transducer structure according to claim 17, further including a glass sheet bonded to said peripheral flange to thereby cover said sensor element, said glass sheet having a V-shaped aperture overlying said cylindrical member to allow contact to be made with said cylindrical member.

19. The semiconductor transducer structure according to claim 15, further including a peripheral flange formed in said carrier wafer and surrounding a central boss also formed in said carrier wafer.

20. The semiconductor transducer structure according to claim 19, wherein said central boss is of a lesser height than said flange, whereby said boss is operative as a stop for said diaphragm area.

21. The semiconductor structure according to claim 20, wherein said central boss is of a greater height than said flange, whereby said boss can accommodate an applied force.

22. The semiconductor transducer structure according to claim 20, further including a glass sheet bonded to said flange of said carrier wafer to cover said boss.

23. The semiconductor transducer structure according to claim 16, further including a central boss bonded to said glass layer and of a height less than said flange.

24. The semiconductor transducer structure according to claim 18, further including a conductive metal material filling said V shaped aperture to provide a terminal contact area.

* * * * *